United States Patent [19]
Takahashi et al.

[11] Patent Number: 5,165,809
[45] Date of Patent: Nov. 24, 1992

[54] PIEZOELECTRIC ACTUATOR AND PRINT HEAD USING THE ACTUATOR, HAVING MEANS FOR INCREASING DURABILITY OF LAMINAR PIEZOELECTRIC DRIVER

[75] Inventors: Yoshikazu Takahashi, Kasugai; Masahiko Suzuki, Nagoya; Makoto Takeuchi; Masaaki Deguchi, both of Okazaki; Yoshihumi Suzuki, Ena; Masashi Suzuki, Nagoya, all of Japan

[73] Assignee: Brother Kogyo Kabushiki Kaisha, Nagoya, Japan

[21] Appl. No.: 663,723

[22] Filed: Mar. 4, 1991

[30] Foreign Application Priority Data

Mar. 6, 1990 [JP] Japan .................................. 2-54339
Mar. 6, 1990 [JP] Japan .................................. 2-54340

[51] Int. Cl.$^5$ ...................... B41J 2/295; H01L 41/08
[52] U.S. Cl. .................... 400/124; 400/157.1; 310/317; 310/323; 310/328
[58] Field of Search ............. 400/124, 157.1; 310/328, 323, 317

[56] References Cited

U.S. PATENT DOCUMENTS

| | | | |
|---|---|---|---|
| 4,633,120 | 12/1986 | Sato et al. | 310/328 |
| 4,644,213 | 2/1987 | Shibuya | 310/328 |
| 4,647,808 | 3/1987 | Shibuya | 310/328 |
| 4,874,978 | 10/1989 | Sakaida | 310/328 |

FOREIGN PATENT DOCUMENTS

| | | | |
|---|---|---|---|
| 65784 | 12/1982 | European Pat. Off. | 400/124 |
| 0352075 | 1/1990 | European Pat. Off. | |
| 20465 | 2/1983 | Japan | 400/157.1 |
| 83764 | 5/1984 | Japan | 400/124 |
| 118266 | 5/1988 | Japan | 400/124 |
| 1598179 | 9/1981 | United Kingdom | |

*Primary Examiner*—Edgar S. Burr
*Assistant Examiner*—Eric Raciti
*Attorney, Agent, or Firm*—Oliff & Berridge

[57] ABSTRACT

An actuator for operating a desired driven member, including a laminar transverse-effect type piezoelectric driver having laminated piezoelectric elements which are displaced upon application of a voltage thereto in the direction of lamination. The actuator has a frame for supporting the piezoelectric driver at one of opposite ends thereof in a direction of displacement perpendicular to the direction of lamination. A transmission mechanism is disposed at the other end of the driver, for transmitting a displacement of the driver to the driven member. A longitudinal-effect type piezoelectric driver whose displacement in the direction of lamination is used to drive the driven member may be used in place of the transverse-effect type, together with an elastic member provided to bias the driven member when the driven member is moved to the operated position.

16 Claims, 9 Drawing Sheets

PIEZOELECTRIC ACTUATOR AND PRINT HEAD USING THE ACTUATOR, HAVING MEANS FOR INCREASING DURABILITY OF LAMINAR PIEZOELECTRIC DRIVER

BACKGROUND OF THE INVENTION

1. Field of the Invention

The present invention relates to an actuator using a laminar piezoelectric or electrostrictive driver for operating a given driven member, and a dot-matrix wire dot print head or printer using such piezoelectric actuator for operating a print wire. More particularly, this invention is concerned with techniques for improving the durability or life expectancy of the laminar piezoelectric driver.

2. Discussion of the Prior Art

A piezoelectric driver uses a piezoelectric element consisting of a piezoelectric ceramic film or layer, and two electrode films or layers which are formed on the opposite surfaces of the piezoelectric ceramic layer. The piezoelectric ceramic layer is displaced, i.e., contracted and expanded or elongated as a voltage applied thereto is changed. It is known to use this piezoelectric element for an actuator, wherein the contraction and expansion of the piezoelectric element are utilized to operate a desired member to be driven. Since the amount of displacement of the piezoelectric element obtained by changing the applied voltage is small, a relatively large number of the piezoelectric elements are superposed on each other to provide a laminar piezoelectric driver which is capable of undergoing contraction and elongation by a large amount. In operation, the laminar piezoelectric driver is elongated (expanded) in the direction of lamination when a voltage is applied (when the applied voltage is increased) to polarize the piezoelectric ceramic layers in the direction parallel to the direction of lamination. When the applied voltage is removed or decreased, the laminar piezoelectric driver is contracted in the direction of lamination. On the other hand, the driver is contracted and elongated in the direction perpendicular to the direction of lamination (direction of polarization) when the voltage is applied and removed, respectively. In a known piezoelectric actuator, however, the contraction and elongation of the laminar piezoelectric driver in the direction of lamination are used to drive the desired driven member. Namely, the conventional laminar piezoelectric driver is fixed to a frame of the actuator, at one of opposite ends which are opposed to each other in the direction of lamination. The other end of the driver is operatively connected to a suitable transmission member or mechanism for transmitting the displacement of the driver to the desired driven member. This type of laminar piezoelectric driver is referred to as "longitudinal-effect" type. A dot-matrix wire dot print head is an example of a piezoelectric actuator which uses such a longitudinal-effect type piezoelectric driver, wherein the displacement of the laminar driver is used to operate a print wire.

However, the known piezoelectric actuator discussed above suffers from a problem. More specifically, the tensile strength of the laminar longitudinal-effect type piezoelectric driver in the direction of lamination depends on the tensile strength of the electrode layers which is relatively low, and on the bonding strength between the piezoelectric ceramic layers and electrode layers. Accordingly, the longitudinal-effect type driver is not sufficiently resistant to the tensile force applied in the direction of lamination. When the laminar driver is contracted in the direction of lamination upon removal of the applied voltage, a tensile force is exerted on the laminar driver since the driver is rapidly contracted while the transmission mechanism tends to remain due to inertia. Thus, the known laminar longitudinal-effect type piezoelectric driver has a high risk of damage due to its relatively low tensile strength.

Similarly, the bending strength of the laminar longitudinal-effect type piezoelectric driver in the direction of lamination depends on the bending strength of the electrode layers, and on the bonding strength between the ceramic and electrode layers. That is, the driver has a low bending strength in the direction of lamination, and is likely to be damaged due to a bending force applied thereto upon generation of a moment by the transmission mechanism.

SUMMARY OF THE INVENTION

It is therefore a first object of the present invention to provide a piezoelectric actuator wherein the laminar piezoelectric driver has improved durability and is less likely to be damaged.

A second object of the present invention is to provide a dot-matrix wire impact print head or printer which uses such a piezoelectric actuator.

The above first object may be achieved according to a first aspect of the present invention, which provides a piezoelectric actuator for operating a desired driven member, comprising: a laminar transverse-effect type piezoelectric driver including a multiplicity of piezoelectric elements which are superposed on each other in a direction of lamination, the piezoelectric elements being displaced as a voltage applied thereto for polarization thereof in the direction of lamination is changed; a frame for supporting the piezoelectric driver at one of opposite ends thereof which are opposed to each other in a direction of displacement perpendicular to the direction of lamination; and a transmission mechanism disposed at the other of the opposite ends of the piezoelectric driver, for transmitting a displacement of the driver in said direction of displacement to the driven member.

In the present piezoelectric actuator, the transverse mode of the reverse piezoelectric effect or the electrostrictive effect is utilized. In other words, the laminar piezoelectric driver is supported such that the direction of displacement transmitted to the transmission mechanism is perpendicular to the direction of lamination of the driver. The tensile strength and bending strength of the laminar piezoelectric driver are larger in the direction perpendicular to the direction of lamination, than in the direction of lamination. While the tensile and bending forces exerted on the driver in the direction of lamination act to separate the piezoelectric ceramic and electrode layers from each other, the same forces exerted on the driver in the direction perpendicular to the direction of lamination do not act to cause the separation of the piezoelectric ceramic and electrode layers. Accordingly, the laminar transverse-effect type piezoelectric driver used in the present actuator is highly resistant to the tensile and/or bending forces applied during operation, and are less likely to be damaged due to the tensile and/or bending forces. Thus, the present piezoelectric actuator is highly durable and reliable in operation.

Further, where the residual strain or displacement of the driver in the direction perpendicular to the direction of lamination is in the form of contraction, this strain results in shortening the length in the direction of displacement. Since the amount of residual strain decreases with a rise in the operating temperature, the length of the driver in the direction of displacement (perpendicular to the direction of lamination) increases with the operating temperature. Namely, the residual strain of the instant transverse-effect type piezoelectric driver has a positive temperature dependence. The length of the driver after the elongation by removal of the applied voltage increases as the operating temperature of the driver rises. In operation, therefore, the instant piezoelectric driver has a positive coefficient of linear thermal expansion, like the frame and the transmission mechanism. This means that the fully retracted position of the piezoelectric driver upon contraction thereof with a voltage applied thereto changes with the operating temperature, in the same direction as the nominal position which is influenced by the thermal expansion coefficient of the frame. Accordingly, the amount of deviation of the fully retracted position from the nominal position is reduced, as compared with that in the known longitudinal-effect type piezoelectric actuator wherein the displacement in the direction of lamination is utilized. Hence, the present piezoelectric actuator may use for the frame a comparatively inexpensive material having a relatively high linear thermal expansion coefficient. Accordingly, the cost of the actuator is accordingly reduced. Further, the reduced amount of deviation indicated above results in reducing the required amount of compensation of the driver by the temperature compensating member, leading to reduction in the size of the temperature compensating member. Moreover, the temperature compensating member may be eliminated, if the amount of the residual strain of the driver is made equal to the amount of thermal expansion of the frame. In this case, the size, weight and cost of manufacture of the piezoelectric actuator are further reduced.

In one form of the invention, the transmission mechanism uses a movable member which is secured to the other end of the piezoelectric driver and which is moved with the other end when the piezoelectric driver is displaced. In this case, the driven member connected to the movable member can be moved without a time delay with respect to the contracting movement of the piezoelectric driver, since the movable member is secured to the driver. Yet, the tensile force applied to the driver does not cause damage to the driver, since the displacement of the driver in the direction perpendicular to the direction of lamination is utilized.

In another form of the invention, the transmission mechanism includes: a movable member which is movable in the direction of displacement of the piezoelectric driver, and which is not secured to the other end of the piezoelectric driver, and an elastic member for biasing the movable member against the other end of the piezoelectric driver. In this case, the transmission mechanism will not apply a tensile force to the piezoelectric driver upon contraction of the driver. Further, upon elongation of the piezoelectric driver, the biasing force of the elastic member is added to the force of elongation of the driver, thereby increasing the operating speed and stroke of the movable member (transmission mechanism) upon elongation of the piezoelectric driver.

The second object indicated above may be achieved according to a second aspect of the present invention, which provides a printer comprising: a print head including a print wire, and a piezoelectric actuator for operating the print wire; and a control circuit for controlling the piezoelectric actuator. The piezoelectric actuator comprises (a) a laminar transverse-effect type piezoelectric driver including a multiplicity of piezoelectric elements which are superposed on each other in a direction of lamination, the piezoelectric elements being displaced as a voltage applied thereto for polarization thereof in the direction of lamination is changed, (b) a frame for supporting the piezoelectric driver at one of opposite ends thereof which are opposed to each other in a direction of displacement perpendicular to the direction of lamination, and (c) a transmission mechanism disposed at the other of the opposite ends of the piezoelectric driver, for transmitting a displacement of the driver to the print wire. The transmission mechanism includes a movable member which is movable in the direction of displacement of the piezoelectric driver, and an amplifying mechanism for enlarging a relative movement between the movable member and the frame, the print wire being connected to the amplifying mechanism. The control circuit is adapted to normally hold the piezoelectric driver in a deenergized state to hold the print wire in a non-printing position, and to be responsive to a printing command to energize the piezoelectric driver for moving the print wire to a printing position. This printer constructed as described above also enjoys the advantages described above with respect to the piezoelectric actuator.

In one form of the printer described above, the amplifying mechanism includes an elastic member for connecting the movable member and the other of the longitudinal ends of the arm, and the movable member is secured to the other end of the piezoelectric driver. The control circuit energizes the piezoelectric driver to contract the same, for moving the print wire from the non-printing position to the printing position, while a biasing force of the elastic member is reduced as the print wire is moved to the printing position. In this case, the biasing or elastic force of the elastic member acts in the same direction as the force of contraction of the driver, thereby increasing the operating speed of the movable member and the print wire. Further, the vibration of the print wire is effectively prevented since the movable member is secured to the driver.

The second object indicated above may also be achieved according to a still further aspect of the present invention, which provides a dot-matrix wire impact print head comprising: a print wire having a printing position for abutting contact with a recording medium, and a non-printing position spaced apart from the medium; a laminar piezoelectric driver which is displaced as a voltage applied thereto is changed; a frame for supporting the piezoelectric driver at one of opposite ends thereof which are opposed to each other in a direction of displacement thereof; a transmission mechanism disposed at the other of the opposite ends of the piezoelectric driver, and connected to the print wire; and an elastic member which stores a biasing force when the print wire is moved to the non-printing position, and which biases the print wire when the print wire is moved to the printing position.

In the dot-matrix wire impact print head of the invention constructed as described above, the print wire is moved to the printing position while being biased by the elastic member. The biasing or elastic force is stored in the elastic member when the print wire is moved from the printing position to the non-printing position. This arrangement has the following advantages in terms of the durability of the laminar piezoelectric driver, by eliminating or reducing the tensile force applied to the driver.

As described above, there is no problem in durability of the piezoelectric driver due to the tensile force, where the piezoelectric driver is of the transverse-effect type. Where the piezoelectric driver is of the longitudinal-effect type, the problem of the tensile force is eliminated if the transmission mechanism is not secured to the other end of the piezoelectric driver. In this case, the print wire tends to easily oscillate and takes a relatively long time before it is settled at the non-printing position. According to the present arrangement, however, this oscillation is prevented by the elastic member. Namely, immediately after the energization of the piezoelectric driver for a printing action, the driver is deenergized to move the print wire to the non-printing position. Since this movement toward the print wire is effected with an increase in the biasing force of the elastic member, the print wire is not likely to oscillate at the non-printing position.

Where the piezoelectric driver is of the longitudinal-effect type while at the same time the transmission mechanism is secured to the driver, the problem of durability due to the tensile force is mitigated or alleviated by effecting a printing movement of the print wire upon contraction of the piezoelectric driver. In this case, the tensile force is exerted on the piezoelectric driver when the print wire is moved to the printing position. However, since the biasing or elastic force of the elastic member is added to the force of contraction of the driver for producing an overall force to drive the print wire to the printing position, the required force of contraction of the driver, i.e., the tensile force exerted on the driver can be reduced by increasing the elastic force of the elastic member when the print wire is in the non-printing position with the driver in the elongated state. Thus, the life expectancy of the longitudinal-effect type driver can be prolonged even if the printing action is effected by using the contraction of the driver.

In the case where the transmission mechanism is secured to the piezoelectric driver, the use of the elastic member for biasing the print wire upon movement toward the printing position is effective to increase the printing speed of the print wire, and improve the operating response and the print quality. In the case where the transmission mechanism is not secured to the driver, the print wire can be settled at the non-printing position in a short time, while the driver is protected from the tensile force upon contraction thereof.

The transmission mechanism may include a movable member which is movable in the direction of displacement of the piezoelectric driver. As described above, the movable member is either secured or not secured to the piezoelectric driver.

The transmission mechanism may include a generally elongate arm which has the print wire fixed thereto at one of longitudinal opposite ends thereof such that the print wire extends from the arm in a direction substantially perpendicular to a longitudinal direction of the arm, the elastic member consisting of a converter spring connecting the other of the longitudinal opposite ends of the arm and the other end of the piezoelectric driver. The above-indicated movable member may be disposed between and connecting the arm and the piezoelectric driver. The print head may further comprise a four member parallel link mechanism for guiding the movable member so that the movable member is translated in the direction of displacement of the piezoelectric driver.

Where the transverse-effect type piezoelectric driver is used, and the transmission mechanism includes the movable member as described above, the piezoelectric driver may be fixed to the print wire through the movable member and the elastic member. In this instance, the piezoelectric driver is deenergized and thereby elongated to move the print wire to the printing position in response to a printing command, while a biasing force of the elastic member is reduced as the print wire is moved to the printing position.

According to a preferred aspect of the invention, there is provided a dot-matrix wire impact print head comprising: a print wire having a printing position for abutting contact with a recording medium, and a non-printing position spaced apart from the medium; a laminar transverse-effect type piezoelectric driver including a multiplicity of piezoelectric elements which are superposed on each other in a direction of lamination, the piezoelectric driver being displaced as a voltage applied thereto is changed; a frame for supporting the piezoelectric driver at one of opposite ends thereof which are opposed to each other in a direction of displacement thereof perpendicular to the direction of lamination; a transmission mechanism disposed at the other of the opposite ends of the piezoelectric driver, and connected to the print wire; and an elastic member which stores a biasing force when the print wire is moved to the non-printing position, and which biases the print wire when the print wire is moved to the printing position.

The print head constructed as described above has both the advantages described above with respect to the piezoelectric actuator according to the first aspect of the invention, and the advantages described above with respect to the dot-matrix wire impact print head according to the second aspect of the invention.

BRIEF DESCRIPTION OF THE DRAWINGS

The above and optional objects, features and advantages of the present invention will be better understood by reading the following detailed description of presently preferred embodiments of the invention, when considered in conjunction with the accompanying drawings, in which.

DETAILED DESCRIPTION OF THE PREFERRED EMBODIMENTS

Figure 1:
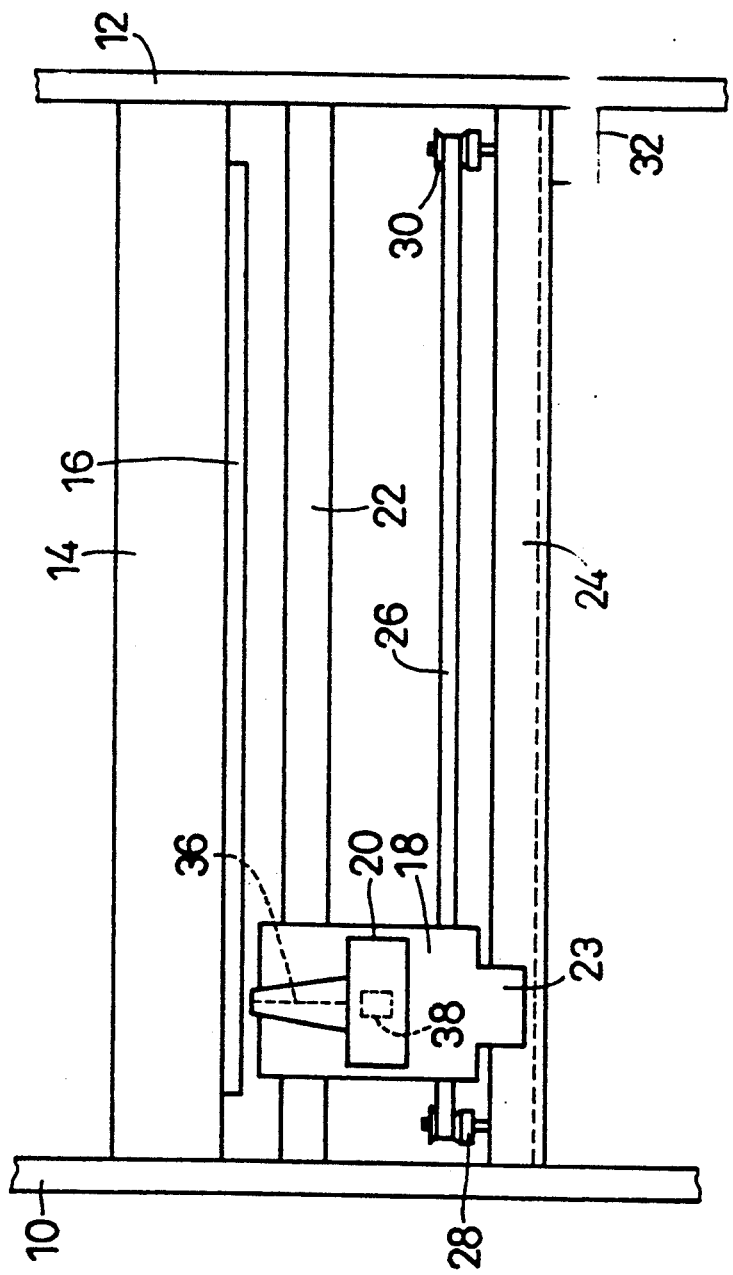
FIG. 1 is a schematic plan view of a dot-matrix wire impact printer having a print head constructed according to one embodiment of this invention.

Referring first to FIG. 1, reference numerals 10, 12 denote a pair of side plates of a frame of a dot-matrix wire impact printer These side plates 10, 12 rotatably support a platen 14 for supporting a recording medium in the form of a recording sheet 16. The platen 14 cooperates with other components such as a paper bail and feed rolls to feed the sheet 16. A print head 20 is mounted on a carriage 18 disposed in facing relation with the platen 14. The side plates 10, 12 also support an eccentric shaft 22 and a guide rail 24 which extend parallel to the length of the platen 14. The carriage 18 engages the guide shaft 22 slidably in the longitudinal direction of the shaft, and has a protrusion 23 which engages the eccentric rail 24 slidably in the longitudinal and transverse directions of the rail. A timing belt 26 is fixed at the opposite ends to the underside of the carriage 18, such that the belt 26 forms an endless loop. The guide rail 24 has a pair of pulleys 28, 30 rotatably mounted thereon, and the belt 26 engages these pulleys 28, 30. The pulley 30 is driven by a carriage drive motor 32, so that the carriage 18 is reciprocated along the platen 14, via the pulley 30 and belt 26.

Figure 2:
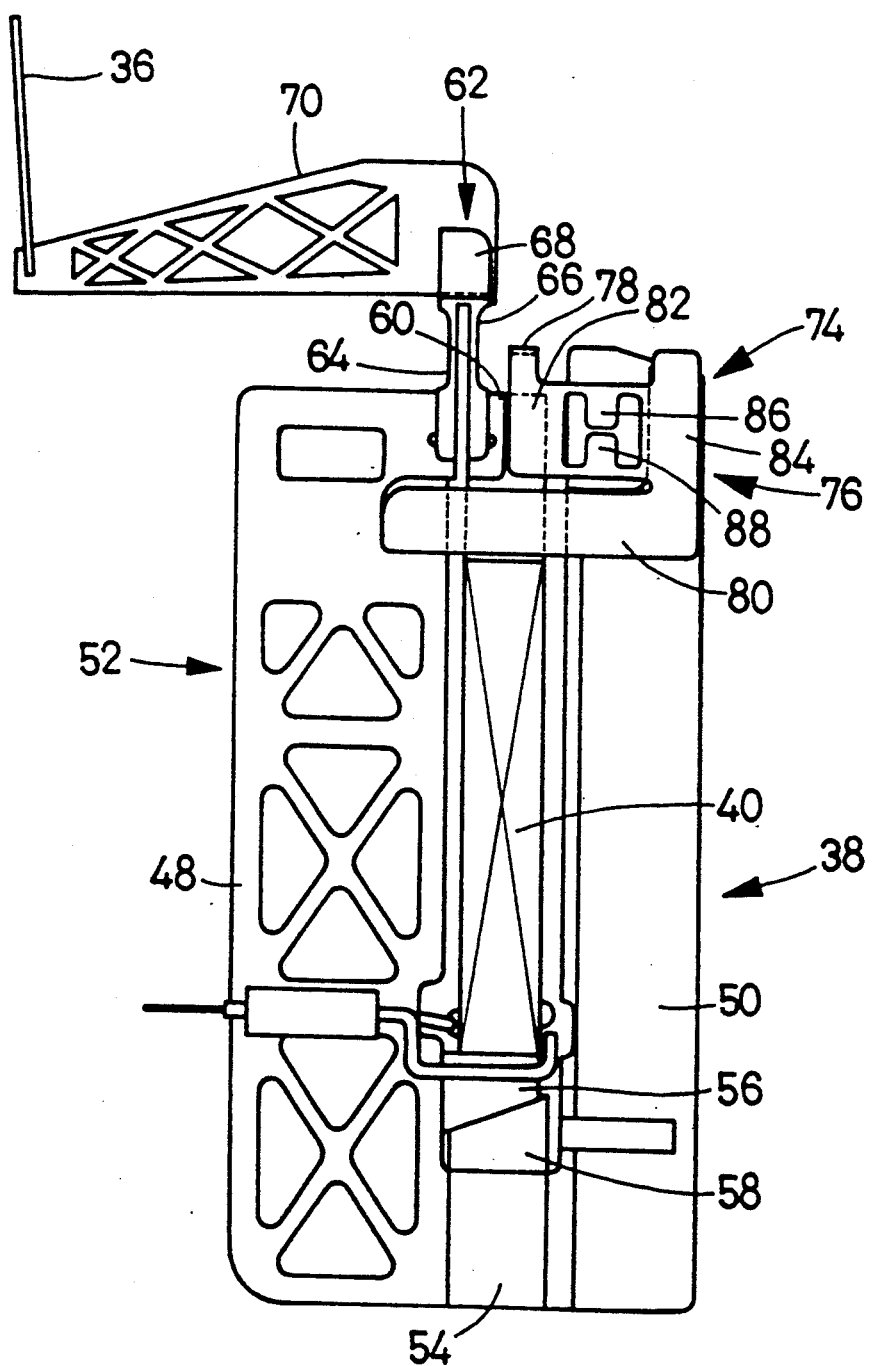
FIG. 2 is a front elevational view of a piezoelectric actuator used in a print head of the printer of FIG. 1.

The print head 20 has a plurality of print wires 36 which are equally spaced from each other in a vertical row, and a plurality of piezoelectric actuators 38 for operating the respective print wires 36 toward and away from the platen 14 between a retracted or non-printing position and an advanced or printing position. As shown in FIG. 2, each piezoelectric actuator 38 has a laminar piezoelectric driver 40 for operating the appropriate print wire 36. The laminar piezoelectric driver 40 consists of a multiplicity of piezoelectric elements 46 superposed on each other. Each piezoelectric element 46 consists of a piezoelectric ceramic layer 42, and adjacent two electrode films 44 which sandwich each piezoelectric ceramic layer 42. That is, the laminar piezoelectric driver 40 consists of the piezoelectric ceramic layers 42 and the electrode layers 44 which are alternately superposed on each other such that each ceramic layer 42 is interposed between the adjacent two electrode layers 44.

Figure 3:
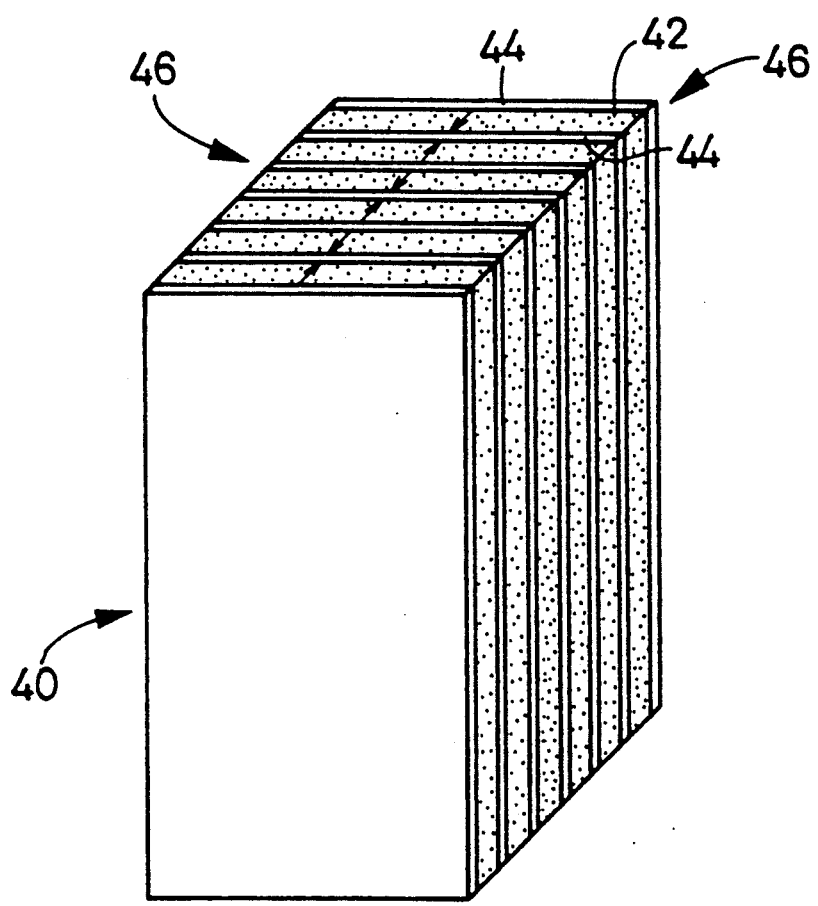
FIG. 3 is a perspective view of a laminar piezoelectric driver used in the piezoelectric actuator of FIG. 2.

In operation, a voltage is applied to each pair of electrode layers 44 in the direction indicated by arrow in FIG. 3. Namely, an electric field is established to polarize the piezoelectric layers 42 in the direction in which the layers 42, 44 are superposed on each other. This piezoelectric driver 40 is contracted in the direction perpendicular to the direction of the applied electric field (direction of lamination), i.e., contracted in the vertical direction as seen in FIG. 3, when the voltage or electric field is applied to the driver 40. Upon removal of the voltage or electric field, the driver 40 is elongated or expanded in the same direction. Thus, the transverse mode of the reverse piezoelectric effect (restrictive effect) of the laminar piezoelectric driver 40 is utilized to drive the print wire 36. Conventionally, a print wire is driven by utilizing the longitudinal mode of the reverse piezoelectric effect, that is, by utilizing displacement of a piezoelectric driver in the direction perpendicular to the direction of the applied electric field (direction of polarization of the piezoelectric layers). Thus, the operating attitude of the present laminar piezoelectric driver 40 is 90° rotated from that of the conventional piezoelectric driver. In the present arrangement or application of the laminar piezoelectric driver 40, a residual strain in the negative direction (i.e., residual amount of contraction) remains in the driver 40 even after the voltage is completely removed from the driver 40. This residual strain results in reduction in the height or vertical dimension (in FIG. 3) of the driver 40 (dimension perpendicular to the direction of lamination of the driver 40), which causes a change in the operated position of the upper end (in FIG. 3) of the driver 40 upon voltage application. Since the residual strain decreases with an increase in the operating temperature of the driver 40, the driver 40 has a positive coefficient of linear thermal expansion in the direction perpendicular to the direction of lamination. For example, the linear thermal expansion coefficient of the driver 40 ranges from $2.0 \times 10^{-6}/°C.$ to $9.0 \times 10^{-6}/°C.$ Referring back to FIG. 2, the laminar piezoelectric driver 40 is supported by and accommodated in a frame 52 which includes a main frame member 48 and a secondary frame member 50. These main and secondary frame members 48, 50 are formed of a sintered steel material having a coefficient of linear thermal expansion of $9.0 \sim 11.7 \times 10^{-6}/°C.$ The secondary frame member 50 is fixed to a support base 54 which is an integral lower part of the main frame member 48. The piezoelectric driver 40 is supported at its lower longitudinal end by the support base 54, through a first and a second temperature compensating member 56, 58 interposed between the support base 54 and the driver 40. It is noted that the longitudinal or height direction of the driver 40 is the direction in which the driver is contracted and elongated upon application and removal of a voltage thereto.

The first and second temperature compensating members 56, 58 are formed of aluminum having a coefficient of linear thermal expansion of $23.9 \times 10^{-6}/°C.$, and are bonded together. The first temperature compensating member 56 is bonded to the lower end face of the piezoelectric driver 40, and the second temperature compensating member 58 is bonded to the support base 54. The mutually bonded surfaces of the first and second temperature compensating members 56, 58 are inclined so as to adjust the longitudinal position of the piezoelectric driver 40 relative to the frame 52, by changing the relative bonding position of the two temperature compensating members 56, 58. These members 56, 58 are provided to maintain the operated position of the piezoelectric driver 40 at a predetermined constant nominal point corresponding to a nominal printing position of the print wire 36, irrespective of a change in the operating position of the driver 40. More specifically, the amount of change in the amount of residual strain of the driver 40 due to a rise in the operating temperature is smaller than the amount of thermal expansion of the frame 52, and the operated position of the driver 40 at the elevated operating temperature does not reach the nominal point. The operated position of the driver 40 is compensated for the shortage of its displacement due to the temperature rise, by the thermal expansion of the temperature compensating members 56, 58 which increases with the temperature, so that the operated position of the driver 40 is held constant irrespective of a change in the operating temperature of the piezoelectric actuator 38.

The upper end face of the laminar piezoelectric driver 40 remote from the temperature compensating member 56 is bonded to a movable member 60 by an adhesive agent. The movable member 60 is supported by the main frame member 48 via an elastic member in the form of a converter spring 62, which includes a first sheet spring 64, a second sheet spring 66 and a tiltable connecting member 68. One end of the first sheet spring 64 is fixed to a portion of the main frame member 48 which is opposed to the movable member 60, while the corresponding one end of the second sheet spring 66 is fixed to the movable member 60. The other ends of the first and second sheet springs 64, 66 are connected to the tiltable connecting member 68, which is fixed to one end of an arm 70 extending in the direction parallel to the direction of lamination of the piezoelectric driver 40. The other end of the arm 70 carries the print wire 36 fixed thereto. When the voltage applied to the piezoelectric driver 40 is removed, the driver 40 is elongated so as to move the second sheet spring 66 in the upward direction as seen in FIG. 2, whereby the two sheet springs 64, 66 are elastically deformed so as to pivot the tiltable connecting member 68 in the counterclockwise direction as seen in FIG. 3. As a result, the arm 70 is pivoted in the same direction, causing the print wire 36 to be moved away from the recording sheet 16 to its retracted or non-printing position. When the voltage is applied to the piezoelectric driver 40, the driver 40 is contracted to move the second sheet spring 66 relative to the first sheet spring 64 in the downward direction, thereby pivoting the connecting member 68 in the clockwise direction, while permitting the sheet springs 64, 66 to release its spring force which was stored due to their elastic deformation during the counterclockwise pivoting of the arm 70. As a result, the arm 70 is pivoted in the clockwise direction, to move the print wire 36 to the advanced or printing position. In the present piezoelectric actuator 38, the direction of extension of the arm 70 from the converter spring 62 is reversed with respect to that in the conventional actuator, whereby the relationship between the direction of displacement (contraction and elongation) of the driver 40 and the direction of movement (advancement and retraction) of the print wire 36 is reversed with respect to that in the conventional actuator. It is also noted that while the amount of displacement of the piezoelectric driver 40 is relatively small, it is amplified or enlarged by a transmission mechanism which includes the movable member 60, converter spring 62 and arm 70, for moving the print wire 36 over a sufficiently large distance between the non-printing and printing positions.

The first and second sheet springs 64, 66 of the converter spring 62 is pre-loaded by a suitable amount, when the piezoelectric driver 40 is assembled in the frame 52. Described in detail, the first sheet spring 64 of the converter spring 62 is fixed to the main frame member 48 while the second sheet spring 66 is fixed to the movable member 60. In this condition, the piezoelectric driver 40 bonded to the first temperature compensating member 56 is interposed between the movable member 60 and the support base 54, and the second temperature compensating member 58 is pushed in between the first temperature compensating member 56 and the support base 54, so as to flex or deflect the two sheet springs 64, 66 by a suitable amount to pre-load the converter spring 62. When the above-indicated components are assembled together, an adhesive agent is applied to the opposite surfaces of the second temperature compensating member 58 and to the surface of the movable member 60 to which the driver 40 is bonded. Thus, the driver 40 is bonded to the movable member 60, while the second temperature compensating member 58 is bonded to the support base 54.

With the converter spring 62 thus pre-loaded, a moment acts on the movable member 60 in the direction that causes the movable member 60 to rotate in the counterclockwise direction, whereby the converter spring 62 tends to be undesirably inclined, causing a faulty printing operation of the print wire 36. To avoid this phenomenon, the present piezoelectric actuator 38 uses a four member parallel link mechanism 74 for preventing the movable member 60 from being pivoted. The parallel link mechanism 74 is formed from sheet springs, by blanking and bending operations. The mechanism 74 has a pair of link plates 76 (only one plate shown in FIG. 2) disposed on the opposite sides of the main and secondary frame members 48, 50 and movable member 60. The link plates 76 are connected by a connector 78, and are fixed to the main frame member 48 at their leg portions 80, and to the movable member 60 at their first link portions 82. The link plates 76 also have second link portions 84 fixed to the end of the secondary frame member 50, and third and fourth link portions 86, 88 disposed between the first and second link portions 82, 84. When the piezoelectric driver 40 is elongated, the first link portions 82 elastically deform and apply to the movable member 60 a moment in the clockwise direction when the link portions 82 are translated with the movable member 60. This clockwise moment counteracts with the counterclockwise moment acting on the movable member 60 due to the pre-load given to the converter spring 62. Thus, the four member parallel link mechanism 74 functions to prevent the movable member 60 from pivoting, and assures an adequate printing operation of the print wire 36. Further, the link mechanism 74 permits the movable member 60 to move in the longitudinal direction of the driver 40 without pivoting, whereby the driver 40 can be contracted and elongated linearly in the longitudinal direction, without a bending or deflecting force applied thereto.

Figure 4:
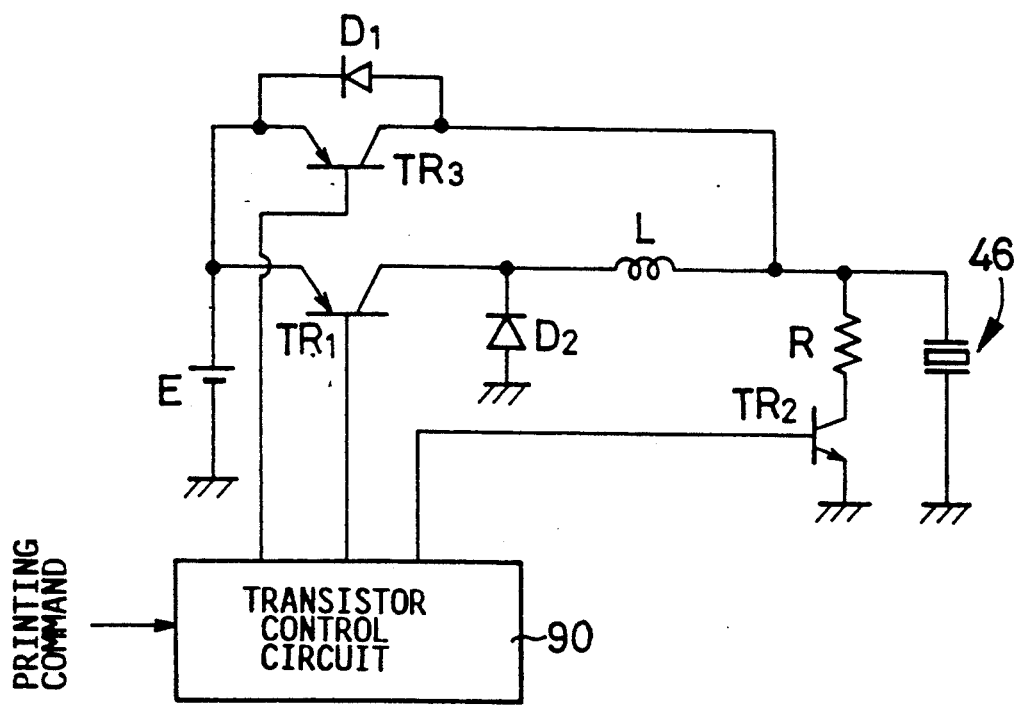
FIG. 4 is a driver circuit for operating the piezoelectric driver of FIG. 3.

The laminar piezoelectric driver 40 is operated by a driver circuit illustrated in FIG. 4. The driver circuit includes a DC power source E, a transistor TR1, a coil L, and the piezoelectric elements 46 of the driver 40, which are connected in series. In FIG. 4, only one piezoelectric element 46 is shown, but all the piezoelectric elements 46 of the driver 40 are connected in parallel to each other. The negative terminals of the DC power source E and piezoelectric element 46 are grounded. The direction of conduction of the transistor TR1 is from the positive terminal of the DC power source E toward the positive one of the electrodes 44 of each piezoelectric element 46. The positive electrode 44 is grounded through a resistor R and a transistor TR2. The direction of conduction of the transistor TR2 is from the resistor R toward the ground. Between the resistor R and the coil L, there is connected a transistor TR3. The direction of conduction of this transistor TR3 is from the positive terminal of the DC power source E toward the positive electrode 44 of the piezoelectric element 46. A diode D1 is provided in parallel connection to the transistor TR3. The diode D1 permits a flow of an electric current in the direction from the positive electrode 44 toward the positive terminal of the DC power source E. The terminal of the coil L connected to the positive terminal of the DC power source E is grounded through a diode D2.

The transistors TR1, TR2 and TR3 are turned on and off by a transistor control circuit 90 (hereinafter simply called "control circuit 90"). The control circuit 90 is adapted to normally hold the transistors TR1, TR2 and TR3 in the off state, so that the piezoelectric driver 40 is deenergized and placed in the elongated state to hold the print wire 36 in the non-printing position. When a printing command for the print wire 36 is received, the control circuit 90 turns on the transistor TR1, while holding the transistors TR2 and TR3 in the off state. As a result, the electric energy of the DC power source E is supplied to the piezoelectric element 46 through the transistor TR1 and coil L, whereby a voltage applied to the piezoelectric element 46 rapidly rises from the zero level at a time constant determined by the inductance of the coil L and the capacitance of the piezoelectric element 46. When the voltage of the piezoelectric element 46 rises to the line voltage of the DC power source E, an electric current flows from the element 46 to the DC power source E through the diode D1, so that the voltage of the element 46 is kept at the line voltage. Namely, the electric energy stored in the coil L is returned to the DC power source E through a closed path which includes the coil L, diode D1, DC power source E and diode D2. With all the piezoelectric elements 46 thus charged, the driver 46 is contracted to advance the print wire 46 to the printing position. The control circuit 90 turns off the transistor TR1 and turns on the transistor TR3 when the voltage of the piezoelectric element 46 becomes equal to the line voltage. Consequently, if the voltage of the element 46 drops from the line voltage, the electric energy is supplied from the source E to the element 46 via the transistor TR3 to re-charge the element 46.

When a time sufficient for the print wire 36 to effect a printing action has passed after the generation of the printing command, the control circuit 90 turns off the transistor TR3 and turns on the transistor TR2, whereby the piezoelectric element 46 is discharged through the resistor R. Namely, the electric energy stored in the element 46 is consumed by the resistor R, and the piezoelectric driver 46 is elongated to return the print wire 36 to the non-printing position. At this time, no electric energy is stored in the coil L since the energy has been returned to the source E. Thus, the element 46 is discharged in a short time. The transistor TR2 is restored to the off state at the moment when the voltage of the element 46 is zeroed, or at a time shortly after that moment. The print wire 36 is held in the non-printing position until a printing command for that wire 36 is again generated for the next printing action.

In the printer constructed as described above, the print wire 36 is placed in the non-printing position, with the piezoelectric driver 40 held in the deenergized state with no voltage applied thereto. In this non-printing condition, the print wire 36 is spaced apart from the platen 14. When the printer is operated to effect a printing operation on the recording sheet 16 set on the platen 14, the print head 30 is moved along the platen 14 while at the same time the recording sheet 16 is fed by the platen 14 and the feed rolls (not shown), in the direction perpendicular to the direction of movement of the print head 30. During these movements of the print head 20 and recording sheet 16, the piezoelectric driver 40 for the print wire 36 is selectively energized and deenergized according to printing data (printing commands). When a printing action is effected by a given print wire 36, a voltage is applied to the corresponding piezoelectric driver 40, whereby the driver 40 is contracted to advance the print wire 36 to the printing position on the side of the sheet 16. Since the converter spring 62 has been deflected during the non-printing period with the driver 40 in the elongated position, the converter spring 62 has a biasing force which is released at the time of contraction of the driver 40. This biasing force cooperates with a pull force produced by the contracted driver 40, to advance the print wire 36 to the printing position. Thus, the biasing force stored in the converter spring 62 during the non-printing period increases the advancing speed and stroke of the print wire 36, resulting in a quick response to the printing command and improved density of a dot formed by the print wire 36.

While the piezoelectric driver 40 is rapidly contracted upon energization thereof to move the print wire 36 to the printing position, the movable member 60 and the arm 70 tend to remain in the same position due to inertia, whereby a tensile force acts on the piezoelectric driver 40 upon contraction of the driver 40. However, the present laminar piezoelectric driver 40 is highly resistant to the tensile force, because the driver 40 is oriented such that its contraction and elongation in the direction perpendicular to the direction of lamination of the piezoelectric elements 46 are used to drive the print wire 36. Thus, the driver 40 is less likely to be damaged due to the tensile force acting thereon upon contraction thereof. Further, the use of the four member parallel link mechanism 74 for suitably guiding the movable member 60 permits the displacement of the driver 40 without a bending or deflecting force applied thereto. However, the movable member 60 may be more or less subject to a force that causes a pivoting action of the movable member which produces a bending force acting on the driver 40. In this event, too, the driver 40 exhibits a high resistance to the bending force in the direction perpendicular to the direction of lamination.

It is also noted that both the residual strain of the laminar piezoelectric driver 40 and the linear thermal expansion coefficient of the frame 52 have positive temperature dependence. Therefore, the frame 52 may be formed of a relatively inexpensive material having a relatively large linear thermal expansion coefficient, accordingly reducing the cost of the piezoelectric actuator 38. Further, the required amount of compensation provided by the first and second temperature compensating members 56, 58 is relatively small because of the positive temperature dependence of the residual strain of the driver 40 and the linear thermal expansion coefficient of the frame 52. Accordingly, the piezoelectric actuator 38 can be made small-sized and lightweight. If the amount of reduction in the residual strain of the piezoelectric driver 40 can be made substantially equal to the amount of thermal expansion of the frame 52, the temperature compensating members 56, 58 may be eliminated. In this case, the cost, weight and size of the piezoelectric actuator 38 may be further reduced.

If a longitudinal-effect type piezoelectric driver whose contraction and elongation in the direction of lamination are used to drive the wire were used in place of the instant piezoelectric driver 40, the print wire is placed in the non-printing position with the driver placed in the energized and elongated position, while the print wire is placed in the print position with the driver placed in the deenergized and contracted position. This means that the print wire is placed in the printing position when the printer is off or at rest. In this condition, the print wire 36 is held in abutting contact with the platen 14, and prevents insertion of the recording sheet 16 when a printing operation is started. Therefore, a suitable mechanism is required for holding the print wire 36 in the non-print position while the printer is not in use. However, the present piezoelectric actuator 38 does not require such a mechanism, since the piezoelectric driver 40 is held in the deenergized or elongated position to hold the print wire 36 in the non-printing position away from the platen 14 while the printer is not in use.

The use of the longitudinal-effect type piezoelectric driver requires a relatively large number of the piezoelectric elements (piezoelectric ceramic layers) if it is required to reduce the thickness of each piezoelectric element for reducing the required voltage applied to the driver. However, the risk of damage to the intermediate product during removal of a binder and the risk of poor uniformity of the grain size of the sintered piezoelectric ceramic material will increase with a decrease in the thickness and an increase in the number of the piezoelectric elements. For assuring high quality of the piezoelectric driver, therefore, it is not possible to considerably reduce the thickness of the piezoelectric elements. In the present piezoelectric actuator 38 using the transverse-effect type piezoelectric driver 40, the displacement of the driver 40 in the direction perpendicular to the direction of lamination of the piezoelectric elements 46 is utilized to drive the print wire 36. Accordingly, the required number of the piezoelectric elements 46 or piezoelectric ceramic layers 42 for obtaining the desired total displacement is relatively small even when the thickness is small. This permits uniform grain size and density of the piezoelectric ceramic material throughout the driver 40 and accordingly improved operating reliability of the driver, while assuring a relatively small thickness of the piezoelectric layers 42 and an accordingly reduced required voltage, as well as reduced size of the driver 40 in the longitudinal direction (direction of contraction and elongation).

Figure 5:
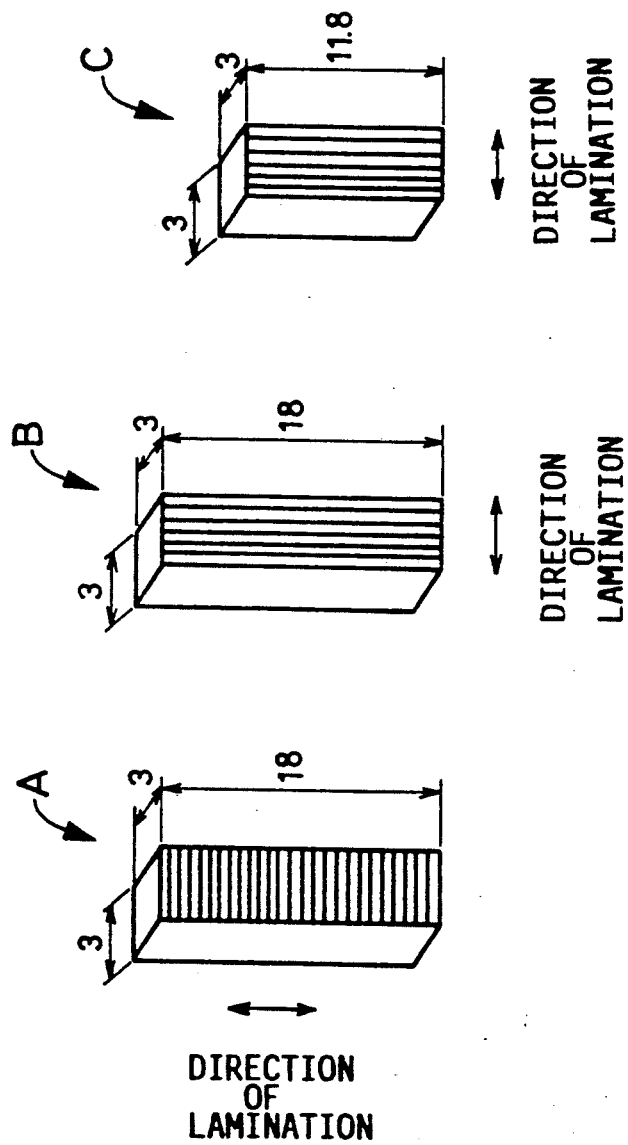
FIG. 5A is a perspective view showing a laminar piezoelectric driver used in a known piezoelectric actuator.
FIGS. 5B and 5C are perspective views showing laminar piezoelectric drivers used in the piezoelectric actuator according to the principle of the invention.

In FIGS. 5A, 5B and 5C, there are illustrated a known longitudinal-effect type laminar piezoelectric driver A, and transverse-effect type laminar piezoelectric drivers and C according to the present invention, respectively. In FIGS. 5A, 5B and 5C, the arrows indicate the direction of lamination of the piezoelectric elements 46. These three piezoelectric driver A, B and C have piezoelectric ceramic layers (42) formed of a piezoelectric ceramic material whose major component consists of lead zirconate titanate (PZT) and which has the following properties:

$$d_{33} = 630 \times 10^{-12} \, [m/V]$$

$$d_{31} = -280 \times 1^{-12} \, [m/V]$$

$$M_{33} = 130 \times 10^{-18} \, [m/V]$$

$$M_{31} = -59 \times 10^{-18} \, [m/V]$$

$$S_{33}{}^E = 1.8 \times 10^{-12} \, [m^2/N]$$

$$S_{11}{}^E = 1.5 \times 10^{-12} \, [m^2/N]$$

where $d_{33}$: piezoelectric constant for longitudinal effect
$d_{31}$: piezoelectric constant for transverse effect
$M_{33}$: electrostrictive constant for longitudinal effect
$M_{31}$: electrostrictive constant for transverse effect
$S_{33}{}^E$: elastic compliance for longitudinal effect
$S_{11}{}^E$: elastic compliance for transverse effect A drive voltage V applied to each piezoelectric ceramic layer, a thickness t of each piezoelectric ceramic layer, number n of the piezoelectric ceramic layers (together with the thickness of the electrode layer), an amount of displacement $\Delta l$ of the driver, and a force F generated by the driver are indicated in the following table, for the piezoelectric drivers A, B and C:

TABLE

|  | A | B | C |
| --- | --- | --- | --- |
| Drive voltage (V) | 108 | 78.7 | 108 |
| Ceramic thickness (t) ($10^{-6}$ m) | 98 | 38 | 38 |
| Electrode thickness ($10^{-6}$ m) | 2 | 2 | 2 |
| Number (n) of ceramic layers | 180 | 75 | 75 |
| Driver displacement ($10^{-6}$ m) | 15 | −15 | −15 |
| Driver force F (N) | 417 | 500 | 762 |
| Dimensions ($10^{-3}$ m) | | | |
| Width | 3 | 3 | 3 |
| Depth | 3 | 3 | 3 |
| Length | 18 | 18 | 11.8 |

The amount of displacement $\Delta l$ (m) and drive force F (N) of the longitudinal-effect type driver A are obtained from the following equations, respectively:

$$\Delta l = d_{33} \cdot V \cdot n + M_{33} \cdot V^2 n/t$$

$$F = A \cdot \Delta l/l \cdot 1/S_{33}{}^E$$

where, A: cross sectional area of the driver A
l: length of the driver A (in the direction of displacement)

The amount of displacement $\Delta l$ (m) and drive force F (N) of the transverse-effect type drivers B and C are obtained from the following equations, respectively:

$$\Delta l = d_{31} \cdot V \cdot l/t + M_{31} \cdot V^2 \cdot l/t^2$$

$$F = A \cdot \Delta l/l \cdot 1/S_{11}{}^E$$

It will be understood from the above table that the transverse-effect type piezoelectric driver B having the same length as the longitudinal-effect type piezoelectric driver A provides the same amount of displacement as the driver A, with a lower drive voltage level, and that the transverse-effect type piezoelectric driver C whose length is almost half that of the driver A provides the same amount of displacement as the driver A and the larger force than the driver A, when driven by the same voltage level. Further, the drivers B and C are capable of generating the same force as the driver A, with the smaller cross sectional area than that of the driver A. Thus, the piezoelectric actuator 38 can be operated more economically with a reduced drive voltage for operating the piezoelectric driver 40, or can be manufactured at a reduced cost with the comparatively small size and weight of the driver 40.

In the above embodiment, the converter spring 62 is given a biasing force due to the deflection thereof during movement of the print wire 36 to the non-printing position, and the print wire 36 is advanced to the printing position by the aid of the biasing force of the converter spring 62 released upon energization of the piezoelectric driver 40. However, it is possible that the print wire 36 is retracted to the non-printing position by the aid of the biasing force of the converter spring 62. In this case, the converter spring 62 is adapted to slightly bias the movable member 60 against the piezoelectric driver 40 when the driver 40 is in the deenergized and elongated state with the print wire 36 placed in the non-printing position. When the driver 40 is energized and contracted, the converter spring 62 is pulled by the driver 40 to advance the print wire 36 to the printing position, while storing a biasing force. This biasing force stored during the printing period is released upon deenergization of the driver 40, thereby aiding the retracting movement of the print wire 36 to the non-printing position.

Figure 6:
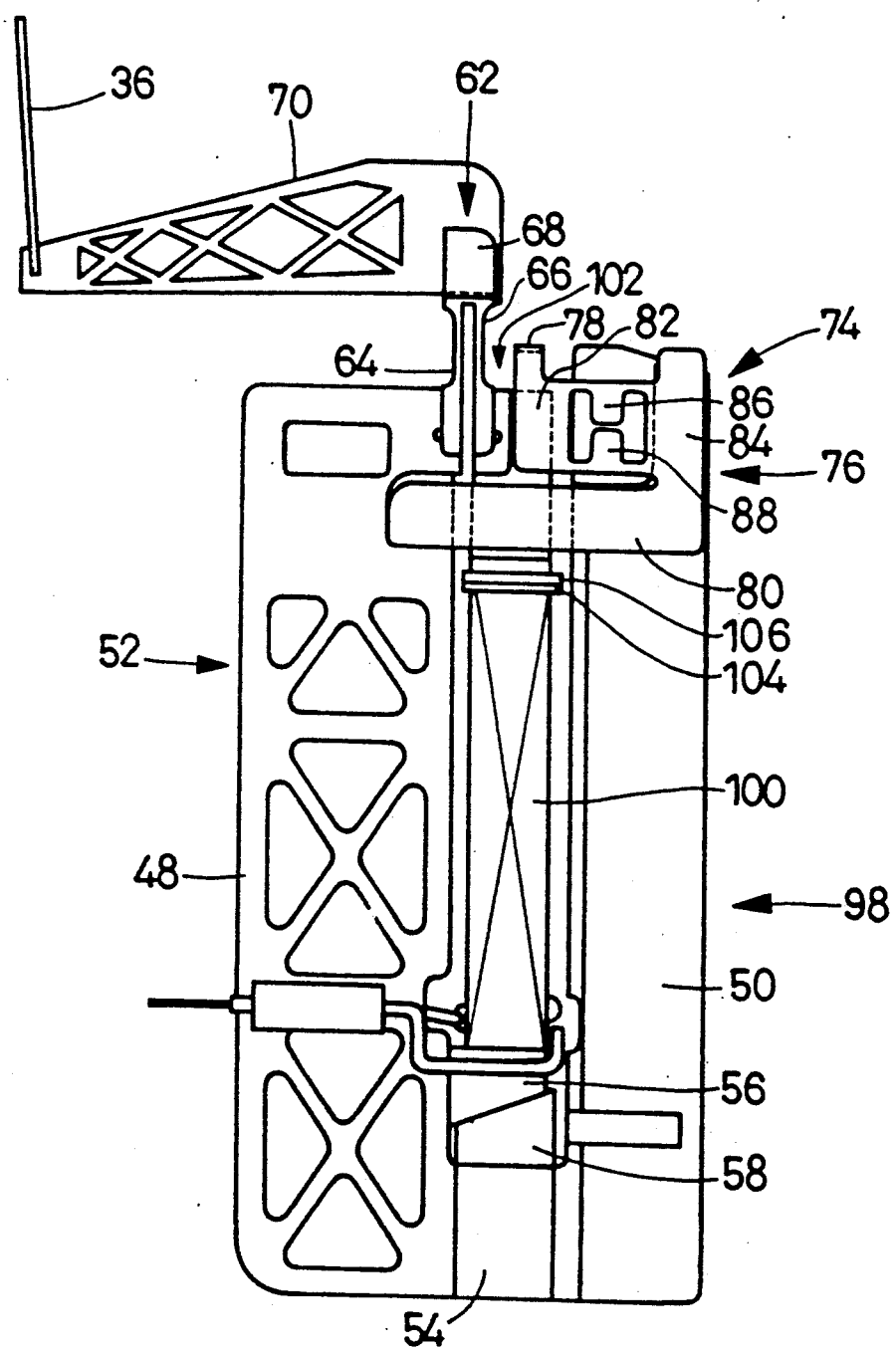
FIG. 6 is a front elevational view showing a piezoelectric actuator according to another embodiment of the invention.

In the embodiment of FIG. 2, the laminar piezoelectric driver 40 and the movable member 60 are bonded together. However, these two components may not be bonded together, as shown in FIG. 6. In this modified piezoelectric actuator generally indicated at 98 in FIG. 6, respective friction plates 104, 106 made of a highly wear-resistant material such as zirconia ceramics are bonded to abutting surfaces of a laminar piezoelectric driver 100 and a movable member 102, so as to avoid wearing of the driver and movable member 100, 102, which would otherwise take place upon abutting contact of the movable member 102 on the end face of the driver 100 when the driver 100 is contracted. Namely, the movement of the movable member 102 in the direction toward the driver 100 upon contraction of the driver 100 tends to be delayed with respect to the contracting movement of the driver 100, whereby the movable member 102 abuts on the end face of the driver 100 with a relatively large shock. Thus, the friction plates 104, 106 are provided to protect the driver 100 and movable member 102 from wearing due to the abutting contact. In the present arrangement in which the driver 100 and the movable member 102 are not bonded together, the driver 100 is not subject to a tensile force. The freedom of the driver 100 from the tensile force, together with the comparatively high tensile and bending strengths of the transverse-effect type laminar drive 100, further improves the piezoelectric actuator 98 wherein the displacement of the driver 100 in the direction of lamination is utilized to drive the print wire 36.

The embodiment of FIG. 6 has another advantage. Namely, when the print wire 36 is advanced to the printing position and is rebounded by the platen 14, the piezoelectric driver 100 has been already fully contracted. Consequently, the print wire 36 is returned away from the recording sheet 16 to the non-printing position, while deflecting the converter spring 62. Although the converter spring 62 tends to advance the print wire 36 again toward the sheet 16, the driver 100 has been deenergized and elongated before this tendency takes place. Therefore, the print wire 36 is prevented from being moved by the spring 62 toward the sheet 16. When the driver 100 is in the elongated position, the biasing force of the converter spring 62 is relatively large, which acts on the movable member 102 so as to force the movable member 102 against the driver 100, whereby the oscillation of the print wire 36 is restricted or prevented, and the print wire 36 settles in a short time. Thus, otherwise possible double printing actions of the print wire 36 and resulting fluctuation in the print density can be avoided.

Figure 7:
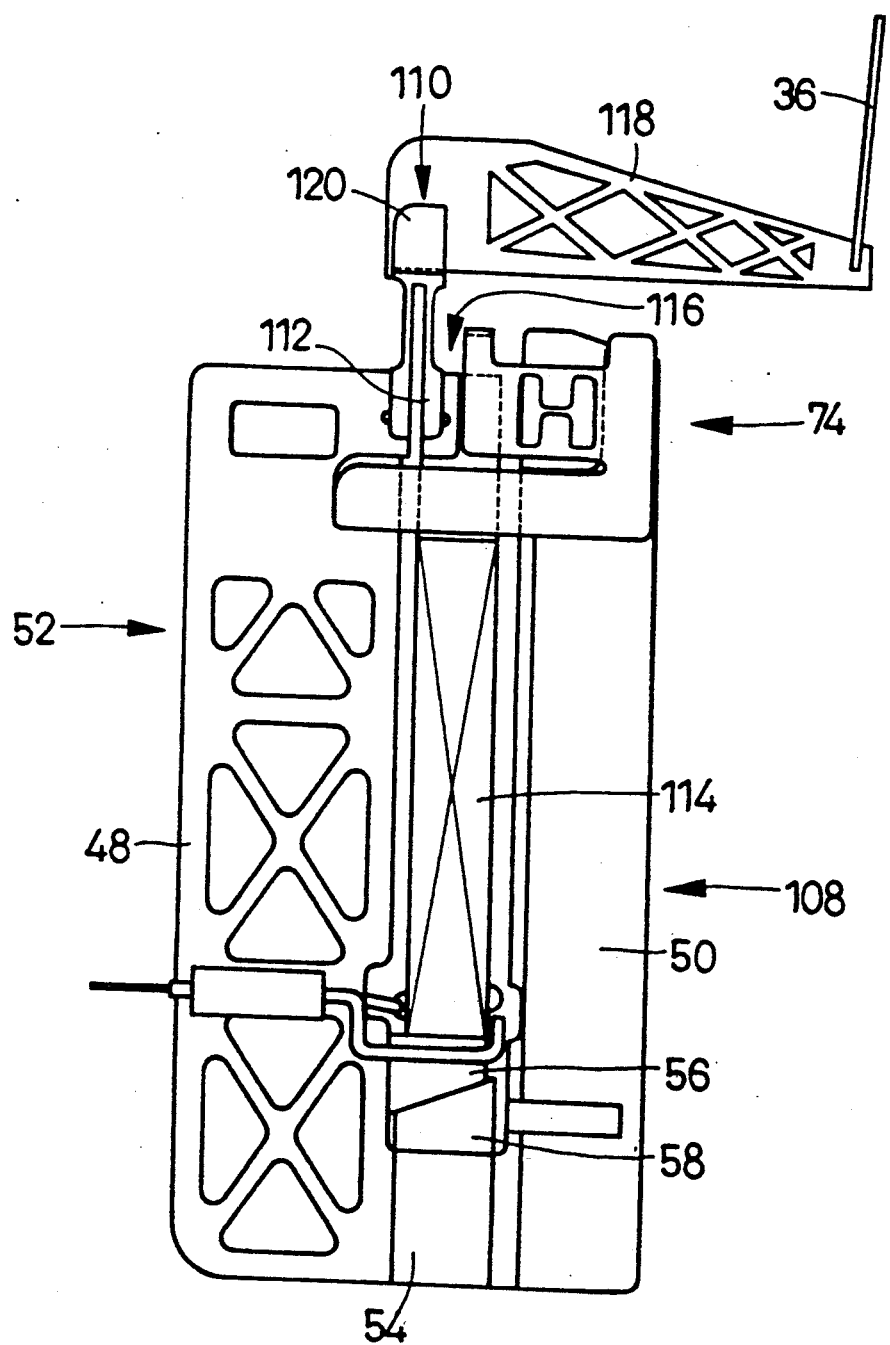
FIG. 7 is a front elevational view showing a piezoelectric actuator according to a further embodiment of the invention.

Referring next to FIG. 7, there is shown a piezoelectric actuator 108 according to a further embodiment of the present invention. This actuator 108 is adapted to advance the print wire 36 to the printing position when a laminar transverse-effect type piezoelectric driver 114 is elongated upon removal of a voltage therefrom. Further, a converter spring 110 stores a biasing force when the print wire 36 is advanced to the printing position upon elongation of the driver 114, and the stored biasing force of the converter spring 110 is released when the print wire 36 is moved to the non-printing position by contraction of the driver 114. In the present piezoelectric actuator 108, the driver 114 is bonded to a movable member 116 connected to the converter spring 110, and an arm 118 is fixed to a tiltable connecting member 120 of the converter spring 110 such that the arm 118 extends in the direction opposite to the direction of extension of the arm 70 in the embodiments of FIGS. 2 and 6.

In the present piezoelectric actuator 108, the print wire 36 is placed in the non-printing position with the piezoelectric driver 114 held in the energized and contracted state, and with a small amount of deflection of the converter spring 110 which is given during assembling of the actuator 108. Upon generation of a printing command for the print wire 36, the piezoelectric driver 114 is deenergized and elongated, causing the second sheet spring 112 to elastically deform and move upward relative to the first sheet spring, whereby the arm 118 is pivoted in the counterclockwise direction as seen in FIG. 7. As a result, the print wire 36 is advanced to the printing position. A predetermined time after the deenergization of the driver 114, the driver 114 is energized and contracted to return the print wire 36 to the non-printing position. At this time, the biasing force of the converter spring 110 stored during the printing action is released and cooperates with the contracting movement of the driver 114, to rapidly return the print wire 36 to the non-printing position. In the present actuator 108, the converter spring 110 acts on the piezoelectric driver 114 in the compressing direction, and the driver 114 is not subject to a large tensile force during operation. Like the piezoelectric drivers 38, 98 of the preceding embodiments, the piezoelectric driver 108 is of the transverse-effect type in which the contraction and elongation in the direction of lamination are utilized to drive the print wire 36. Therefore, the present driver 108 is also highly resistant to the tensile and bending forces, and enjoys the advantages described above with respect to the first embodiment, namely, improved durability, reduced weight and size, and reduced cost of manufacture.

The piezoelectric actuator 108 may be modified such that the print wire 36 is advanced to the printing position by the aid of a biasing force released by the converter spring 110. In this case, the biasing force is stored in the converter spring 110 when the print wire 36 is returned to the non-printing position, that is, when the piezoelectric driver 114 is energized and contracted so as to pull the converter spring 110. The stored biasing force of the converter spring 110 is released upon deenergization and elongation of the piezoelectric driver 114 for advancing the print wire 36 to the printing position. This modified arrangement permits a rapid printing action of the print wire 36, with high response to the printing command, and assures dense and clear printing, as in the embodiment of FIG. 6.

Figure 8:
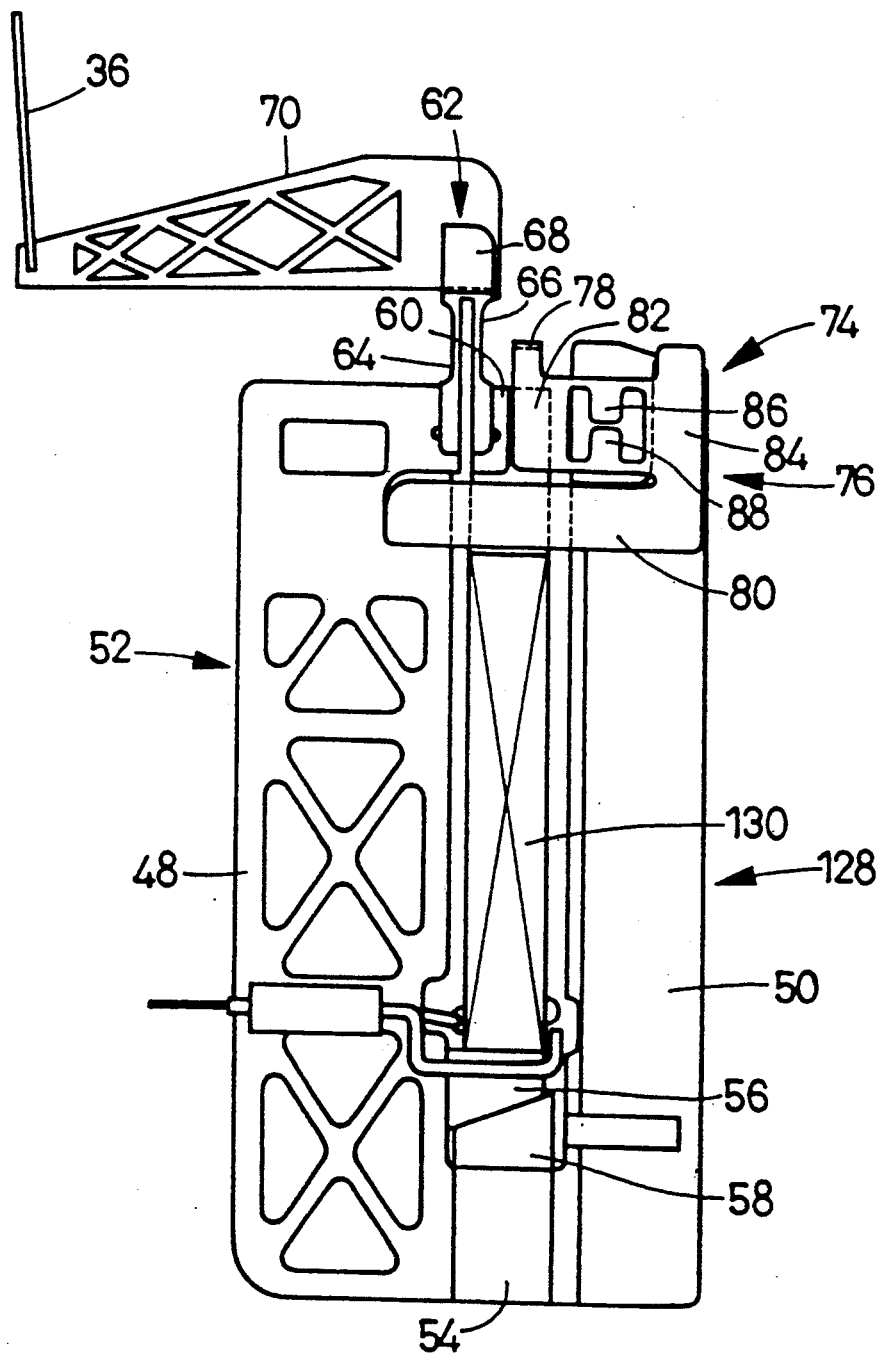
FIG. 8 is a front elevational view showing a piezoelectric actuator according to a still further embodiment of the invention.
Figure 9:
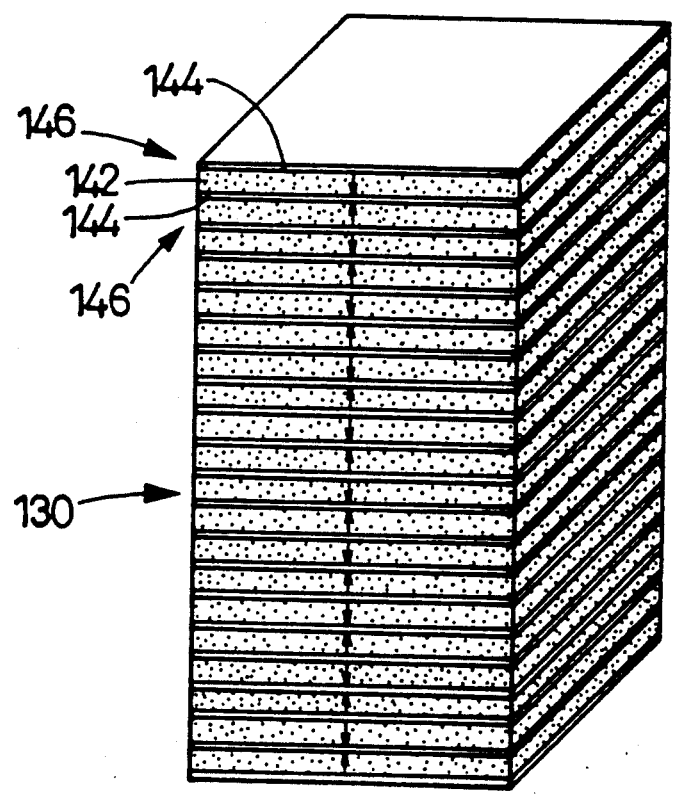
FIG. 9 is a perspective view of a piezoelectric driver used in the actuator of FIG. 8.

Reference is now made to FIGS. 8 and 9, which show a still further embodiment of the present invention in the form of a piezoelectric actuator 128 which uses a laminar transverse-effect type piezoelectric driver 130. Except for the driver 130, the present actuator 128 uses the same components as used in the embodiments of FIGS. 2 and 6, and the same reference numerals as used in FIGS. 2 and 6 will be used to identify the corresponding components.

The piezoelectric driver 130 consists of multiple piezoelectric elements 146 each consisting of a piezoelectric ceramic layer 142 and two adjacent electrode layers 144, as shown in FIG. 9. In other words, the piezoelectric ceramic layers 142 and electrode layers 144 are alternately superposed on each other. Upon application of a voltage between the electrode layers 144, the piezoelectric ceramic layers 142 of the driver 130 thus laminated are polarized in the direction indicated by arrows in FIG. 9, i.e., in the direction of lamination of the driver 130. As a result, the piezoelectric driver 130 is expanded in the direction of polarization or lamination, and contracted in the direction perpendicular to the direction of lamination. With the voltage removed, the driver 130 is contracted in the direction of lamination. In the present piezoelectric actuator 128, the displacement of the piezoelectric driver 130 in the direction of polarization or lamination is used to drive the print wire 36. For this reason, the piezoelectric driver 130 is referred to as the "longitudinal-effect" type as distinguished from the "transverse-effect" type used in the preceding embodiments.

In the present piezoelectric actuator 128, the longitudinal-effect type piezoelectric driver 130 has a residual strain in the positive direction (in the form of elongation in the upward direction in FIG. 8) even after a voltage is completely removed from the piezoelectric ceramic layers 142. The amount of the residual strain decreases with a rise in the operating temperature of the driver 130. Consequently, the operated position of the piezoelectric driver 130 does not reach the nominal point corresponding to the printing position of the print wire 36, when the operating temperature is relatively high, even if a constant voltage is applied to the driver 130 to induce a constant amount of elongation. That is, the distance between the operated position of the driver 130 and the nominal point increases as the operating temperature rises. Therefore, the first and second temperature compensating members 56, 58 which expand with the temperature are used for compensation for the above distance, to maintain the operated position of the driver 130 at the nominal point, irrespective of a change in the operating temperature of the actuator 128.

In operation, the piezoelectric driver 130 is energized to hold the print wire 36 in the printing position, and deenergized to advance the print wire 36 to the printing position. More specifically, the driver 130 energized with a voltage applied thereto is elongated to move the second sheet spring 66 relative to the first sheet spring 64 in the upward direction, whereby the sheet springs 64, 66 are elastically deformed or deflected, causing the tiltable connecting member 68 to pivot in the counterclockwise direction as seen in FIG. 8. Consequently, the arm 70 is pivoted in the same direction, to retract the print wire 36 to the non-printing position spaced apart from the recording sheet 16. When the driver 130 is deenergized, it is contracted, permitting the second sheet spring 66 to move relative to the first sheet spring 64 in the downward direction, while releasing the biasing force which is stored during movement of the wire 36 to the non-printing position. As a result, the connecting portion 68 is pivoted in the clockwise direction, causing the arm 70 to pivot in the same direction to advance the print wire 36 to the printing position.

As in the embodiment of FIG. 6, the movable member 60 is not bonded to the upper or operating end of the piezoelectric driver 130. However, the movable member 60 is held in abutting contact with the driver 130, under the biasing action of the converter spring 62.

The piezoelectric driver 130 is operated by the same driver circuit as shown in FIG. 4, but the control circuit 90 is modified to control the driver 130 in the following manner.

Upon generation of a printing command, the transistor TR3 is turned off while the transistor TR2 is turned on, so that the piezoelectric elements 146 are discharged and contracted to advance the print wire 36 to the printing position. The transistor TR2 is then turned off while the transistor TR1 is turned on, to charge the piezoelectric elements 146, whereby the driver 130 is elongated to return the print wire 36 to the non-printing position. After power is applied to the printer provided with the present piezoelectric actuator 128, the print wire 36 is normally placed in the non-printing position with the driver 130 held in the energized and elongated state. Upon generation of the printing command, the driver 130 is deenergized and contracted to move the print wire 36 to the printing position.

When the printer is not in use with no power applied thereto, however, the print wire 36 is placed in the printing position with the driver 130 held deenergized. To avoid abutting contact of the print wire 36 with the platen 14 in the above condition, the carriage 18 is retracted by rotation of the eccentric shaft 22, to move the print wire 36 away from the platen 14, before the printer is turned off. When the printer is turned on, the piezoelectric driver 130 is energized to normally hold the print wire in the print wire 36 in the non-printing position. Then, the eccentric shaft 22 is rotated to advance the carriage 18 to establish the predetermined distance between the recording sheet 16 and the non-printing position.

When the piezoelectric driver 130 is contracted, the biasing force stored in the converter spring 62 is released, aiding the print wire 36 in advancing for abutting contact with the recording sheet 16. The print wire 36 propelled by the converter spring 62 is rebounded by the platen 14 toward the non-printing position. Since the piezoelectric driver 130 has been contracted, the converter spring 62 is deflected while the print wire 36 is moved away from the sheet 16. Although the converter spring 62 acts to move the print wire 36 again toward the recording sheet 16, the advancing movement of the print wire 36 is prevented by the driver 130 which has already been energized and elongated. When the driver 130 is in the elongated state, the biasing force of the converter spring 62 is large, and the movable member 60 is biased by this large biasing force against the end face of the driver 130, whereby the oscillation of the print wire 36 is avoided. Hence, the print wire 36 settles at the non-printing position in a short time. Even if the print wire 36 oscillates, the driver 130 prevents the print wire 36 from contacting the sheet 16 again.

While the longitudinal-effect type piezoelectric driver 130 consisting of the piezoelectric elements 146 is comparatively less resistant to a tensile force in the direction of lamination thereof, the movable member 60 is not bonded to the driver 130 to protect the driver 130 against a tensile force. Although the damage of the driver 130 due to the tensile force is avoided by the separation of the driver 130 from the movable member 60, this arrangement is likely to suffer from easy oscillation or vibration of the movable member 60. However, this drawback is avoided by the biasing force of the converter spring 62 as described above. Thus, the present laminar longitudinal-effect piezoelectric driver 130 is highly durable, and is highly reliable in operation without a double printing phenomenon or a fluctuation in the print density.

If the print wire 36 oscillates, the print wire rebounded from the sheet 16 again comes into abutting contact with the sheet 16, causing a double printing in which the same local spots on the sheets 16 are impacted twice by the print wire 36. If the movable member 60 is moved in the direction that causes the print wire 36 to move toward the printing position, while the print wire 36 is retracted away from the sheet 16, the force by which the print wire 36 is forced against the sheet 16 is reduced by the force by which the print wire 36 is retracted toward the non-printing position, whereby the print density is reduced. If the movable member 60 is moved in the direction that causes the print wire 36 to move toward the printing position, while the print wire 36 is moved toward the sheet 16, the print density is increased. In the present piezoelectric actuator 128, however, the oscillation of the print wire 36 is prevented to avoid the double printing phenomenon and assure uniform print density.

If the movement of the movable member 60 upon contraction of the piezoelectric driver 130 is delayed due to inertia, the driver 130 and the movable member 60 are once separated from each other and then contact each other. In this sense, the use of friction plates as indicated at 104, 106 in FIG. 6 is desirable to avoid direct abutting contact of the driver and movable member 130, 60, for improving the life expectancy of the actuator 128.

In the above embodiment, the biasing force stored in the converter spring 62 is released upon contraction of the piezoelectric driver 130. In this respect, the movable member 60 may be bonded to the piezoelectric driver 130. In this case, a compressive force is exerted on the driver 130 when the biasing force is released from the converter spring 62. Accordingly, the tensile force exerted on the driver 130 due to the inertial force of the movable member 60 is reduced. In this sense, the bonding of the driver 130 and the movable member 60 does not have a significant adverse influence on the durability of the driver 130. Rather, the bonding permits the driver 130 to produce a drive force for advancing the print wire 36 upon contraction of the driver 130, which drive force is added to the biasing force of the converter spring 62 released upon contraction of the driver 130. Thus, the printing response and the print density are further improved in the present modified embodiment.

While the present invention has been described in its presently preferred embodiments, it is to be understood that the invention is not limited to the details of the illustrated embodiments, but may be otherwise embodied.

Although the piezoelectric actuators 38, 98, 108, 128 use the amplifying mechanism using the arm 70, 118 for enlarging or amplifying the displacement of the piezoelectric driver 40, 100, 114, 130, the principle of the present invention is applicable to a piezoelectric actuator which does not have such mechanism and in which the displacement of the piezoelectric driver is transmitted directly to a print wire or other member to be driven.

In the illustrated embodiments, the converter spring 62, 110 biases the print wire 36 in one of opposite directions toward the printing and non-printing positions. However, the converter spring may be adapted such that the biasing direction is switched when the print wire 36 reaches at a point intermediate between the printing and non-printing positions.

While the converter spring 62 functions not only as an elastic member or biasing means but also as means for connecting the movable member 60 to the print wire 36, it is possible to modify the connecting means and use an exclusive biasing member for biasing the print wire 36.

It is to be understood that the present invention may be embodied with various other changes, modifications and improvements, which may occur to those skilled in the art, without departing from the spirit and scope of the invention defined in the following claims.

What is claimed is:

1. A piezoelectric actuator for operating a desired driven member, comprising:

a laminar transverse-effect type piezoelectric driver having opposite ends and including a multiplicity of piezoelectric elements which are superposed on each other in a direction of lamination, said piezoelectric elements being displaced as a voltage applied thereto for polarization thereof in said direction of lamination is changed;

a frame for supporting said piezoelectric driver at one of said opposite ends such that said opposite ends are opposed to each other in a direction of displacement perpendicular to said direction of lamination; and a transmission mechanism disposed at the other of said opposite ends of said piezoelectric driver, for transmitting a displacement of said driver in said direction of displacement to said driven member.

2. A piezoelectric actuator according to claim 1, wherein said transmission mechanism includes a movable member which is secured to said other end of said piezoelectric driver and which is moved with said other end when said piezoelectric driver is displaced.

3. A piezoelectric actuator according to claim 1, wherein said transmission mechanism includes:

a movable member which is movable in said direction of displacement of said piezoelectric driver, and which is not secured to said other end of said piezoelectric driver; and an elastic member for biasing said movable member against said other end of said piezoelectric driver.

4. A piezoelectric actuator according to claim 1, wherein said transmission mechanism includes a movable member which is movable in said direction of displacement of said piezoelectric driver, and an amplifying mechanism for enlarging a relative movement between said movable member and said frame, said driven member consisting of a print wire which is incorporated in a print head and which is connected to said amplifying mechanism.

5. A piezoelectric actuator according to claim 4, wherein said amplifying mechanism includes:

a generally elongate arm which has longitudinal opposite ends and which has said print wire fixed thereto at one of said longitudinal opposite ends such that said print wire extends from said arm in a direction substantially perpendicular to a longitudinal direction of said arm; and a converter spring connecting the movable member and the other of said longitudinal opposite ends of said arm.

6. A piezoelectric actuator according to claim 5, further comprising a four member parallel link mechanism for guiding said movable member so as to translate said movable member in said direction of displacement of said piezoelectric driver, while preventing rotation of said movable member.

7. A printer comprising:
a print head including a print wire, and a piezoelectric actuator for operating said print wire; and
a control circuit for controlling said piezoelectric actuator,
said piezoelectric actuator comprising (a) a laminar transverse-effect type piezoelectric driver having opposite ends and including a multiplicity of piezoelectric elements which are superposed on each other in a direction of lamination, said piezoelectric elements being displaced as a voltage applied thereto for polarization thereof in said direction of lamination is changed, (b) a frame for supporting said piezoelectric driver at one of said opposite ends, said opposite ends being opposed to each other in a direction of displacement perpendicular to said direction of lamination, and (c) a transmission mechanism disposed at the other of said opposite ends of said piezoelectric driver, for transmitting a displacement of said driver to said print wire,
said transmission mechanism including a movable member which is movable in said direction of displacement of said piezoelectric driver, and an amplifying mechanism for enlarging a relative movement between said movable member and said frame, said print wire being connected to said amplifying mechanism,
said control circuit normally holding said piezoelectric driver in a deenergized state to hold said print wire in a non-printing position, and being responsive to a printing command to energize said piezoelectric driver for moving said print wire to a printing position.

8. A printer according to claim 7, wherein said amplifying mechanism includes a generally elongate arm which has longitudinal opposite ends and which has said print wire fixed thereto at one of said longitudinal opposite ends, said amplifying mechanism further including an elastic member for connecting said movable member and said other of said longitudinal opposite ends of said arm, and said movable member is secured to said other of said longitudinal opposite ends of said piezoelectric driver, said piezoelectric driver being energized and thereby contracted to move said print wire from said non-printing position to said printing position, said elastic member having a biasing force which is reduced as said print wire is moved to said printing position.

9. A printer according to claim 7, wherein said amplifying mechanism includes an elastic member for connecting said movable member and said other of said longitudinal ends of said arm, said piezoelectric driver being energized and thereby contracted to move said print wire from said non-printing position to said printing position, said elastic member having a biasing force which is increased as said print wire is moved to said printing position.

10. A printer comprising:
a print head including a print wire, and a piezoelectric actuator for operating said print wire; and
a control circuit for controlling said piezoelectric actuator,
said piezoelectric actuator comprising (a) a laminar transverse-effect type piezoelectric driver having opposite ends and including a multiplicity of piezoelectric elements which are superposed on each other in a direction of lamination, said piezoelectric elements being displaced as a voltage applied thereto for polarization thereof in said direction of lamination is changed, (b) a frame for supporting said piezoelectric driver at one of said opposite ends such that said opposite ends are opposed to each other in a direction of displacement perpendicular to said direction of lamination, and (c) a transmission mechanism disposed at the other of said opposite ends of said piezoelectric driver, for transmitting a displacement of said driver to said print wire,
said transmission mechanism including a movable member which is movable in said direction of displacement of said piezoelectric driver, and an amplifying mechanism for enlarging a relative movement between said movable member and said frame, said amplifying mechanism including a generally elongate arm having longitudinal opposite ends, said print wire being connected to one of said longitudinal opposite ends of said arm, said amplifying mechanism including an elastic member for connecting said movable member and said other of said longitudinal ends of said arm, said elastic member having a biasing force,
said control circuit normally holding said piezoelectric driver in an energized state to hold said print wire in a non-printing position, and being responsive to a printing command to deenergize said piezoelectric driver for moving said print wire to a printing position while the biasing force of said elastic member is increased.

11. A dot-matrix wire impact print head comprising:
a print wire having a printing position for abutting contact with a recording medium, and a non-printing position spaced apart from said medium;
a laminar piezoelectric driver which has opposite ends and which is displaced as a voltage applied thereto is changed;
a frame for supporting said piezoelectric driver at one of said opposite ends such that said opposite ends are opposite to each other in a direction of displacement thereof;
a transmission mechanism disposed at the other of said opposite ends of said piezoelectric driver, and connected to said print wire, said transmission mechanism including a generally elongate arm which has longitudinal opposite ends and which has said print wire fixed thereto at one of said longitudinal opposite ends such that said print wire extends from said arm in a direction substantially perpendicular to a longitudinal direction of said arm; and
a converter spring which stores a biasing force when said print wire is moved to said non-printing position, and which biases said print wire when said print wire is moved to said printing position, said converter spring connecting the other of said longitudinal opposite ends of said arm and said other end of said piezoelectric driver;

said transmission mechanism further including a movable member disposed between and connecting said other longitudinal end of said arm and said other end of said piezoelectric driver; and a four member parallel link mechanism for guiding said movable member so as to translate said movable member in said direction of displacement of said piezoelectric driver, while preventing rotation of said movable member.

12. A dot-matrix wire impact print head according to claim 11, wherein said movable member is movable in said direction of displacement of said piezoelectric driver, and which is secured to said other opposite end of said piezoelectric driver.

13. A dot-matrix wire impact print head according to claim 11, wherein said movable member is movable in said direction of displacement of said piezoelectric driver, and which is not secured to said other opposite end of said piezoelectric driver.

14. A dot-matrix wire impact print head according to claim 11, wherein said direction of displacement of said laminar piezoelectric driver is perpendicular to a direction of lamination of said laminar piezoelectric driver, said movable member being movable in said direction of displacement, said other end of said piezoelectric driver being fixed to said print wire through said movable member and said converter spring, said piezoelectric driver being deenergized and thereby elongated to move said print wire to said printing position in response to a printing command, while a biasing force of said converter spring is reduced as said print wire is moved to said printing position.

15. A dot-matrix wire impact printer comprising:
a print head including (a) a print wire having a printing position for abutting contact with a recording medium, and a non-printing position spaced apart from said medium, (b) a laminar piezoelectric driver which has opposite ends and which is displaced as a voltage applied thereto is changed, (c) a frame for supporting said piezoelectric driver at one of said opposite ends such that said opposite ends are opposed to each other in a direction of displacement thereof, (d) a transmission mechanism disposed at the other of said opposite ends of said piezoelectric driver, and connected to said print wire; and (e) an elastic member which stores a biasing force when said print wire is moved to said non-printing position, and which biases said print wire when said print wire is moved to said printing position; and a control circuit for normally holding said piezoelectric driver in an energized state to hold said print wire in said non-printing position, and being responsive to a printing command to deenergize said piezoelectric driver for moving said print wire to said printing head.

16. A dot-matrix wire impact print head comprising:
a print wire having a printing position for abutting contact with a recording medium, and a non-printing position spaced apart from said medium;

a laminar piezoelectric driver having opposite ends and including a multiplicity of piezoelectric elements which are superimposed on each other in a direction of lamination, said piezoelectric driver being displaced as a voltage applied thereto is changed;

a frame for supporting said piezoelectric driver at one of said opposite ends such that said opposite ends are opposed to each other in a direction of displacement thereof perpendicular to said direction of lamination;

a transmission mechanism disposed at the other of said opposite ends of said piezoelectric driver, and connected to said print wire; and an elastic member which stores a biasing force when said print wire is moved to said non-printing position, and which biases said print wire when said print wire is moved to said printing position.

* * * * *